United States Patent
Pinter et al.

(10) Patent No.: US 6,436,506 B1
(45) Date of Patent: *Aug. 20, 2002

(54) TRANSFERRABLE COMPLIANT FIBROUS THERMAL INTERFACE

(75) Inventors: Michael R. Pinter, Colbert; Nancy F. Dean, Liberty Lake; William B. Willett; Amy Gettings, both of Spokane, all of WA (US); Charles Smith, Escondido, CA (US)

(73) Assignee: Honeywell International Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/103,416

(22) Filed: Jun. 24, 1998

(51) Int. Cl.[7] .............................. B32B 33/00; H05K 7/20
(52) U.S. Cl. .............................. 428/86; 428/90; 428/96; 428/97; 361/704; 361/707; 361/709; 361/710
(58) Field of Search .............................. 428/90, 86, 96, 428/97, 352; 361/704, 707, 709, 710; 427/206; 174/16.3, 17 VA

(56) References Cited

U.S. PATENT DOCUMENTS

| | | | |
|---|---|---|---|
| 3,972,821 A | * | 8/1976 | Weidenbenner et al. ...... 252/75 |
| 3,973,059 A | | 8/1976 | Brown et al. |
| 4,459,332 A | | 7/1984 | Giglia .......................... 428/86 |
| 4,485,429 A | | 11/1984 | Mittal .......................... 361/386 |
| 4,603,731 A | | 8/1986 | Olsen |
| 4,685,987 A | | 8/1987 | Fick |
| 4,849,858 A | | 7/1989 | Grapes et al. |
| 5,014,161 A | | 5/1991 | Lee et al. ..................... 361/388 |
| 5,077,637 A | | 12/1991 | Martorana et al. |
| 5,150,748 A | | 9/1992 | Blackmon et al. |
| 5,178,924 A | * | 1/1993 | Johnson et al. ................ 428/40 |
| 5,213,868 A | * | 5/1993 | Liberty et al. ............... 428/131 |
| 5,402,006 A | | 3/1995 | O'Donley .................... 257/796 |
| 5,455,458 A | | 10/1995 | Quon et al. .................. 257/714 |
| 5,542,471 A | | 8/1996 | Dickinson |
| 5,674,585 A | | 10/1997 | Ewing, Jr. et al. ............. 428/96 |
| 5,691,022 A | * | 11/1997 | Knauf ........................ 428/40.1 |
| 5,695,847 A | | 12/1997 | Brown et al. ................ 428/112 |
| 5,725,707 A | * | 3/1998 | Koon et al. .................. 156/157 |
| 5,726,495 A | | 3/1998 | Aihara et al. ............... 257/722 |
| 5,852,548 A | * | 12/1998 | Koon et al. .................. 361/704 |
| 5,858,537 A | | 1/1999 | Brown et al. |

(List continued on next page.)

FOREIGN PATENT DOCUMENTS

| | | | | |
|---|---|---|---|---|
| WO | WO9728044 | | 8/1997 | ............ B64G/1/50 |
| WO | WO00/20525 | * | 4/2000 | |

OTHER PUBLICATIONS

U.S. application No. 09/333,564, Dean et al., filed Jun. 21, 1999.
U.S. application No. 09/735,305, Smith, filed Jan. 31, 2001.
S. Bolgen, "Flocking Technology", Journal of Coated Fabrics, vol. 21, Oct. 1991, pp. 123–131.
M. Shigematsu et al., "Application of Electrostatic Flocking to Thermal Control Coating", pp. 583–586.
A. Kato et al., "Fomation of a Very Low–Reflectance Surface by Electrostatic Flocking", 4th European Symposium on Space Environmental and Control Systems, Florence, Italy, Oct. 21–24, 1991, pp. 565–568.

*Primary Examiner*—Cheryl A. Juska
(74) *Attorney, Agent, or Firm*—Wells St. John P.S.

(57) ABSTRACT

Described is a transferrable fibrous thermal interface. The interface comprises flocked thermally conductive fibers embedded in an adhesive in substantially vertical orientation with portions of the fibers extending out of the adhesive. An encapsulant fills spaces between the portions of the fibers that extend out of the adhesive and a release liner is on at least one outer surface of the interface.

25 Claims, 1 Drawing Sheet

U.S. PATENT DOCUMENTS

| | | | |
|---|---|---|---|
| 5,873,973 A | | 2/1999 | Koon et al. .............. 156/272.4 |
| 5,898,570 A | * | 4/1999 | Koon et al. ................. 361/704 |
| 5,912,805 A | * | 6/1999 | Freuler et al. .............. 361/705 |
| 6,054,198 A | * | 4/2000 | Bunyan et al. ............ 428/40.5 |
| 6,084,775 A | * | 7/2000 | Bartley et al. .............. 361/705 |
| 6,090,484 A | * | 7/2000 | Bergerson ................... 428/355 |

* cited by examiner

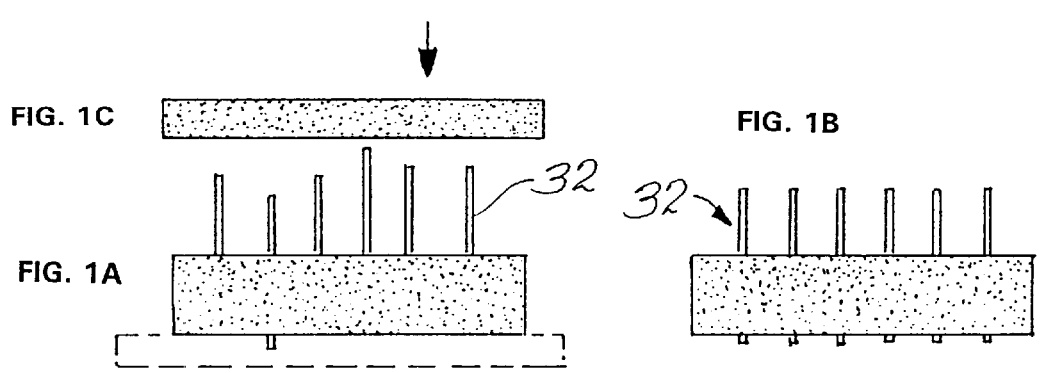
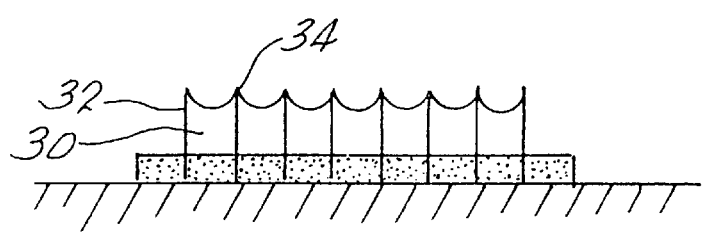

TRANSFERRABLE COMPLIANT FIBROUS THERMAL INTERFACE

BACKGROUND OF THE INVENTION

A popular practice in the industry is to use thermal grease, or grease-like materials, alone or on a carrier to transfer the excess heat across physical interfaces. However, the performance of these materials breaks down or deteriorates when large deviations from surface planarity cause gaps to form between the mating surfaces or when large gaps between mating surfaces are present for other reasons, such as variation in surface heights, manufacturing tolerances, etc. When the heat transfer ability of these materials breaks down, the performance of the component to be cooled is adversely affected. The present invention provides fibrous interfaces that deal effectively with heat transfer across physical interfaces.

BRIEF DESCRIPTION OF THE DRAWINGS

FIGS. 1A, 1B and 1C are schematic views showing electroflocked fibers in adhesive, pushed into the adhesive and resulting in more or less even fiber lengths extending from the adhesive; and FIG. 2 is a schematic showing encapsulant between fibers and the free-fiber tips;

SUMMARY OF THE INVENTION

In one aspect of the invention there is provided a fibrous interface material sandwiched between two layers of a removable paper or release liner. The interface comprises flocked, e.g. electroflocked, mechanically flocked, pneumatically flocked, etc., thermally conductive fibers embedded in an adhesive or tacky substance in substantially vertical orientation with portions of the fibers extending out of the adhesive. An encapsulant is disposed to fill spaces between portions of the fibers that extend out of the adhesive, leaving a free fiber structure at the fiber tips.

Another aspect of the invention is a method of making a fibrous interface. In the method, thermally conductive fibers of desired length are provided and, if necessary, cleaned. A release liner is coated with an adhesive or tacky substance, and the fibers are flocked to that release liner so as to embed the fibers into the adhesive or tacky substance with a portion of the fibers extending out of the adhesive. The adhesive is cured and the space between fibers if filled with a curable encapsulant. A second piece of release liner is placed over the fiber ends. Then the fibers in the adhesive with the release liner over the fibers in the adhesive with the encapsulant in the spaces between the fibers is compressed to a height less than the normal fibers' length and clamped at the compressed height. Thereafter the encapsulant is cured while under compression to yield a free fiber tip structure with the fiber tips extending out of the encapsulant. (Alternatively, the adhesive and encapsulant may be cured concurrently, or the adhesive not cured, as hereafter discussed.)

DETAILED DESCRIPTION OF THE INVENTION

An interface material advantageously possesses a low bulk thermal resistance and a low contact resistance. A suitable material is one that conforms to the mating surfaces, e.g. wets the surfaces. The bulk thermal resistance can be expressed as a function of the material's thickness, thermal conductivity and area. The contact resistance is a measure of how well a material is able to make contact with a mating surface. This thermal resistance of an interface can be written as follows:

$$\Theta\,interface = \frac{t}{kA} + 2\,\Theta_{contact}$$

where $\Theta$ is thermal resistance t is material thickness k is thermal conductivity of material A is area of interface The term $$\frac{t}{kA}$$

represents the thermal resistance of the bulk material and 2 $\Theta_{contact}$ reflects thermal contact resistance at the two surfaces.

A good interface material should have low bulk resistance and low contact resistance, i.e. at the mating surfaces.

Many applications require that the interface material accommodate deviations from surface flatness resulting from manufacturing, and/or warpage of components due to coefficient of thermal expansion (CTE) mismatches.

A material with a low value for k, such as a thermal grease, performs well if the interface is thin, i.e. t is low. If the interface thickness increases by as little as 0.002 inches, the thermal performance can drop dramatically. Also, for such applications, differences in CTE between the mating components causes this gap to expand and contract with each temperature or power cycle. This variation of the interface thickness can cause pumping of fluid interface materials (such as grease) away from the interface.

Interfaces with a larger area are more prone to deviations from surface planarity as manufactured. To optimize thermal performance, the interface material must be able to conform to non-planar surfaces and thereby lower contact resistance.

Optimal interface materials possess a high thermal conductivity and a high mechanical compliance, e.g. will yield elastically when force is applied. High thermal conductivity reduces the first term of Equation 1 while high mechanical compliance reduces the second term. An aligned thermally conductive fibrous material can accomplish both of these goals. Properly oriented, the thermally conductive fibers will span the distance between the mating surfaces thereby allowing a continuous high conductivity path from one surface to the other. If the fiber is flexible and able to move in its tip region, better contact can be made with the surface. This will result in an excellent degree of surface contact and will minimize the contact resistance of the interface material.

To distribute or allow external heat dissipation, an interface material can be applied between the component to be cooled and an external heat dissipating device such as a heat sink. The interface material then accommodates manufacturing induced deviations from planarity from both the cooled component and heat dissipating surface component. The interface material may be applied to either the heat dissipating surface, e.g. heat sink, heat pipe, heat plate, thermoelectric cooler, etc. or to the cooled component surface. The heat dissipating device may be attached to the cooled component through the use of spring clips, bolts, or adhesive, etc. in any conventional manner.

The interface material may be made as follows:

Suitable thermally conductive fibers such as diamond fibers, carbon fibers, graphite fibers, metal fibers, e.g. copper fibers and aluminum fibers, are cut to length, e.g. from 0.0005 to about 0.250 inches and having a diameter greater than about 3 microns up to 100 microns. Presently, fibers of about 10 microns diameter are preferred. Desirable fibers have a thermal conductivity greater than about 25 W/mK. Fibers of the type that are useful include those available Amoco identified as K-1100, K-800, P-120, P-100, P-70 and T50; as well as fibers available from Toray designated M46J and M46JB.

The fibers are cleaned, if necessary. Cleaning the fibers tends to remove any coatings present on the fibers. Some commercially available fibers are sold with a coating applied to the surface which is preferably removed by cleaning. One method of cleaning is by heating the fibers in air to burn off the coating, i.e. sizing. However, chemical cleaning methods can be also used.

To produce an interface, first an adhesive or tacky material is applied to a release liner or waxy silicone coated paper or other sheet material. Alternatively, a transfer tape material that is typically available in sheet or roll form and includes an adhesive pre-applied to a release liner or carrier may be used. The release liner or coated paper may be either electrically conductive or thin enough (less than 0.005 inches) so as not to inhibit the generation of an electrical field with a metal backing plate. Advantageously, the adhesive will produce a low stress bond or adherence. This can be a tacky substrate comprising a silicone gel (e.g. RTV6166 from General Electric Corporation), although uncured epoxy, gels, gasket materials, silicones, organosilicones, BMI, or cyanate esters are also useful.

The fibers are flocked to an adhesive, thereby embedding the fibers in the adhesive, as shown in FIG. 1A, for example by electroflocking. Electroflocking is a well-known procedure whereby two plates, separated some distance, are charged to opposite polarity. The procedure is described generically by Bolgen (Bolgen Stig W., "Flocking Technology", Journal of Coated Fabrics, Volume 21, page 123, 1991) and specifically for electroflocking of carbon Fibers by Shigematsu in "Application of Electrostatic Flocking to Thermal Control Coating", Proceedings of the 14th International Symposium on Space Technology and Science, 1984, page 583; and by Kato in "Formation of a Very Low-reflectance Surface by Electrostatic Flocking", Proceedings of the 4th European Symposium on Space Environmental and Control Systems, 1991, page 565. The disclosure of these articles is expressly incorporated herein by reference.

In the electroflocking process, fibers on one plate pick up that plate's charge and become attracted to the opposite plate. They embed in the adhesive when they hit the opposite plate. If they do not stick initially, fibers bounce back and forth between plates until they become embedded in the adhesive, or escape the electric field or the charge on the plates is removed. The fiber structure that results is aligned with respect to the electric field lines, i.e. has a substantially vertical orientation, and has a velvet-like appearance.

Mechanical flocking involves passing an adhesive coated object over a series of rapidly rotating rollers or beater bars, which cause the substrate to vibrate. Fibers are fed onto the substrate by gravity from a hopper. The vibrations produced by the rollers or beater bars orient the fibers and drive them into the adhesive. Excess fiber is removed, leaving a fiber structure with substantially vertical orientation.

Pneumatic flocking uses an airstream to deliver fibers to an adhesive coated surface. While in flight, fibers align themselves in the direction of the airflow and embed in the adhesive in an oriented manner.

Different flocking methods may be used alone, or in conjunction with one another, e.g., pneumatic/electrostatic flocking. With this combination method, an airstream containing fibers is directed through a nozzle. At the exit of the nozzle, a charge orients the fibers with respect to electric field lines. The fiber structure that results is also aligned, i.e., has substantial vertical orientation, but may be denser, more uniform or produced more rapidly than when either method is used alone.

The flocked fibers are seated into the adhesive with a portion of their lengths extending from the adhesive layer, referred to as "free fiber tips". After flocking, a downward force is applied to the free fiber tips to seat the fibers in the adhesive and minimize the distance between the fiber tips embedded in the adhesive and the release liner to which the adhesive is applied, as shown in FIGS. 1B and 1C.

The adhesive, or tacky substance, is then cured, e.g. by self-curing or application of heat. Oftentimes heating for about 30 minutes at about 150° C. may be used for curing, depending on the adhesive and curing conditions.

As shown in FIG. 2, an encapsulant, 30, for example a gel such as GE RTV6166 dielectric gel available from General Electric Corporation is introduced to fill space between fibers 32 leaving free fiber tips 34 extending from the gel. This can be done by stenciling uncured gel onto the fibers or applying the gel to the fibers and letting the gel soak or wick in. It is advantageous to use a gel that spontaneously wets the fibers and will wick into the fiber structure. The gel may or may not include a thermally conductive filler material. A release liner, i.e. waxy or silicone coated paper may be placed on top of the fibers and uncured gel to prevent the cured gel/fiber material from sticking to a clamping fixture, and provide protection to the interface material during shipping or subsequent handling.

The interface material with uncured gel between the fibers is compressed to less than the nominal cut fiber length and clamped in place to this compressed height. For example, if the fiber is about 0.020 inches long, adhesive cured gel is introduced then clamped to a height of about 0.017 inches before curing the gel which holds the fiber at this height while the gel is cured.

A second release liner of, for example waxy or silicone coated paper, is placed on top of the gel and fibers. This top release liner serves to prevent the gel from sticking to fixtures used during compression and also provides protection during shipping or subsequent handling.

The gel is then cured, e.g. thermally cured, while under compression. Heating generally accelerates curing and is desirable to create a beneficial free-fiber tip structure. Both the compression and thermal cure aid in creating the free-fiber tip structure. The thermal cure is beneficial since the CTE of the gel is higher than that of the fibers and the gel will shrink more than the fibers upon cooling to room temperature, thereby exposing more fiber tips.

In producing the interface material, the adhesive curing may be delayed to coincide with the curing of the gel. In this case, the fibers are seated at the same time as the gel and the adhesive are cured. As indicated, compression is beneficial, and curing under compression is beneficial, because the gel will maintain the cured thickness and the fibers can spring back somewhat to stick up from the gel. Cohesion of the gel to the fibers is not strong enough to keep the fibers from assuming their original position prior to curing. This results in the free fiber tips which are desirable for enhanced thermal contact with the adjacent surface(s).

The interface material, sandwiched between two sheets of release liner, may be cut or stamped to the desired shape using conventional methods (e.g., steel rule die cut), after the desired shape is cut. For use, the first release liner is removed and the tacky adhesive is attached to one of the physical interface surfaces. The second release liner, if present, may then be removed and the two components to be interfaced put together.

It is apparent from the foregoing that various changes and modifications may be made without departing from the invention. Accordingly, the scope of the invention should be limited only by the appended claims, wherein:

What is claimed is:

1. A transferable thermal interface having:
    an encapsulant and a plurality of thermally conductive fibers forming a thermally conductive composite; and
    individual fibers having a length and the encapsulant having a thickness encapsulating a portion of the individual lengths of the plurality of fibers;
    wherein the improvement comprises a release liner, the thermally conductive composite being over the release liner and the fibers extending downwardly to contact the release liner.

2. The interface of claim 1 wherein an average length of the fibers is greater than an average thickness of the encapsulant along an average direction of the fiber lengths, the improvement further comprising the thermally conductive composite including such encapsulant being over the release liner.

3. The interface of claim 1 wherein the encapsulant includes a gel, the improvement further comprising the thermally conductive composite including gel being over the release liner.

4. The interface of claim 1 wherein the composite further includes:
    the fibers embedded in a support material having a first surface and a second opposing surface, the fiber portions extending upwardly out of the second opposing surface;
    the encapsulant between the fiber portions and over the support material; and
    a third surface defining an outermost surface of the thermally conductive composite except for the fibers terminating in tips that are elevationally above the third surface and the encapsulant;
    wherein the improvement further comprises the support material being on the release liner.

5. The interface of claim 1 wherein the thermally conductive composite further includes a support material and wherein the improvement further comprises the support material being on the release liner, the encapsulant being on the support material, and the fibers being in the support material.

6. The interface of claim 1 wherein the improvement further comprises the release liner comprising a silicone coated sheet.

7. The interface of claim 1 wherein the improvement further comprises the release liner having a thickness less than 0.005 inches.

8. The interface of claim 1 wherein the improvement further comprises the release liner being electrically conductive.

9. The interface of claim 1 wherein the improvement further comprises another release liner over the encapsulant and fibers.

10. A transferable thermal interface having:
    an encapsulant and a plurality of thermally conductive fibers forming a thermally conductive composite; and
    individual fibers having a length and the encapsulant having a thickness encapsulating a portion of the individual lengths of the plurality of fibers;
    wherein the improvement comprises an electrically conductive release liner having a thickness less than 0.005 inches, the thermally conductive composite being over the release liner and at least some of the plurality of fibers extending downwardly to contact the release liner.

11. The interface of claim 10 wherein an average length of the fibers is greater than an average thickness of the encapsulant along an average direction of the fiber lengths, the improvement further comprising the thermally conductive composite including such encapsulant being over the release liner.

12. The interface of claim 10 wherein the encapsulant includes a gel, the improvement further comprising the thermally conductive composite including gel being over the release liner.

13. The interface of claim 10 wherein the composite further includes:
    the fibers embedded in a support material having a first surface and a second opposing surface, the fiber portions extending upwardly out of the second opposing surface;
    the encapsulant between the fiber portions and over the support material; and
    a third surface defining an outermost surface of the thermally conductive composite except for the fibers terminating in tips that are elevationally above the third surface and the encapsulant;
    wherein the improvement further comprises the support material being on the release liner.

14. The interface of claim 13 wherein the improvement further comprises the fibers extending downwardly to at or below the first surface of the support material.

15. The interface of claim 10 wherein the thermally conductive composite further includes a support material and wherein the improvement further comprises the support material being on the release liner, the encapsulant being on the support material, and the fibers being in the support material.

16. The interface of claim 10 wherein the improvement further comprises the release liner comprising a silicone coated sheet.

17. The interface of claim 10 wherein the improvement further comprises another release liner over the encapsulant and fibers.

18. A transferable thermal interface having:
    an encapsulant and a plurality of thermally conductive fibers forming a thermally conductive composite; and
    individual fibers having a length and the encapsulant having a thickness encapsulating a portion of the individual lengths of the plurality of fibers;
    wherein the improvement comprises an electrically conductive release liner, the thermally conductive composite being over the release liner.

19. The interface of claim 18 wherein an average length of the fibers is greater than an average thickness of the encapsulant along an average direction of the fiber lengths, the improvement further comprising the thermally conductive composite including such encapsulant being over the release liner.

20. The interface of claim 18 wherein the encapsulant includes a gel, the improvement further comprising the thermally conductive composite including gel being over the release liner.

21. The interface of claim 18 wherein the composite further includes:
- the fibers embedded in a support material having a first surface and a second opposing surface, the fiber portions extending upwardly out of the second opposing surface;
- the encapsulant between the fiber portions and over the support material; and
- a third surface defining an outermost surface of the thermally conductive composite except for the fibers terminating in tips that are elevationally above the third surface and the encapsulant;
- wherein the improvement further comprises the support material being on the release liner.

22. The interface of claim 21 wherein the improvement further comprises the fibers extending downwardly to at or below the first surface of the support material.

23. The interface of claim 18 wherein the thermally conductive composite further includes a support material and wherein the improvement further comprises the support material being on the release liner, the encapsulant being on the support material, and the fibers being in the support material.

24. The interface of claim 18 wherein the improvement further comprises the release liner comprising a silicone coated sheet.

25. The interface of claim 18 wherein the improvement further comprises another release liner over the encapsulant and fibers.

* * * * *